(12) United States Patent
Lu et al.

(10) Patent No.: US 10,429,698 B2
(45) Date of Patent: Oct. 1, 2019

(54) METHOD FOR FABRICATING ARRAY SUBSTRATE, ARRAY SUBSTRATE AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Yanchun Lu, Beijing (CN); Jideng Zhou, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/764,028

(22) PCT Filed: Aug. 10, 2017

(86) PCT No.: PCT/CN2017/096837
§ 371 (c)(1),
(2) Date: Mar. 28, 2018

(87) PCT Pub. No.: WO2018/126688
PCT Pub. Date: Jul. 12, 2018

(65) Prior Publication Data
US 2019/0056626 A1    Feb. 21, 2019

(30) Foreign Application Priority Data

Mar. 1, 2017 (CN) .......................... 2017 1 0002000

(51) Int. Cl.
*G02F 1/1337* (2006.01)
*H01L 27/12* (2006.01)
(Continued)

(52) U.S. Cl.
CPC ...... *G02F 1/133723* (2013.01); *G02F 1/1368* (2013.01); *G03F 1/32* (2013.01);
(Continued)

(58) Field of Classification Search
CPC ............. H01L 31/1016; H01L 31/1888; H01L 31/022491; H01L 21/02074;
(Continued)

(56) References Cited

U.S. PATENT DOCUMENTS 6,060,714 A *   5/2000   Zhong ............... H01L 27/14676
                                              250/214.1
7,785,940 B2 *  8/2010   Kwack .................. G02F 1/1362
                                              257/59
(Continued)

FOREIGN PATENT DOCUMENTS

CN    102707523 A    10/2012
CN    103021939 A    4/2013
(Continued)

OTHER PUBLICATIONS

International search report dated Nov. 6, 2017 for corresponding application No. PCT/CN2017/096837 with English translation attached.
(Continued)

*Primary Examiner* — William Coleman
(74) *Attorney, Agent, or Firm* — Nath, Goldberg & Meyer; Joshua B. Goldberg; Daniel Bissing (57) ABSTRACT

The present disclosure discloses a method for fabricating an array substrate, including: providing a base substrate which includes a transparent substrate, a data electrode pattern layer formed on the transparent substrate, and an insulation layer covering the data electrode pattern layer, the data electrode pattern layer comprising at least one data electrode; forming a via-hole penetrating through the insulation layer so as to expose at least a part of one of the at least one
(Continued)

data electrode; forming a transparent electrode material layer; forming a transparent electrode layer which includes a transparent electrode and a connecting portion connected to the transparent electrode, the connecting portion being located in the via-hole so as to electrically connect the transparent electrode with a corresponding data electrode, and a filling being provided above the connecting portion. The present disclosure also discloses an array substrate and a display device.

16 Claims, 3 Drawing Sheets

(51) Int. Cl.
| | |
|---|---|
| *H01L 29/786* | (2006.01) |
| *H01L 29/66* | (2006.01) |
| *G02F 1/1368* | (2006.01) |
| *G03F 7/16* | (2006.01) |
| *G03F 7/039* | (2006.01) |
| *G03F 7/20* | (2006.01) |
| *G03F 1/32* | (2012.01) |
| *G03F 7/26* | (2006.01) |
| *G03F 7/038* | (2006.01) |
| *H01L 21/027* | (2006.01) |
| *G02F 1/1333* | (2006.01) |

(52) U.S. Cl.
CPC ............. G03F 7/038 (2013.01); G03F 7/039 (2013.01); G03F 7/16 (2013.01); G03F 7/2002 (2013.01); G03F 7/26 (2013.01); H01L 21/0274 (2013.01); H01L 27/124 (2013.01); H01L 27/1222 (2013.01); H01L 27/1259 (2013.01); H01L 27/1288 (2013.01); H01L 29/66765 (2013.01); H01L 29/78669 (2013.01); *G02F 2001/133397* (2013.01)

(58) Field of Classification Search
CPC ............... H01L 27/1259; H01L 27/124; H01L 29/78669; G02F 1/133723; G02F 1/1368; G03F 7/26; G03F 7/32
See application file for complete search history.

(56) References Cited

U.S. PATENT DOCUMENTS

| | | | |
|---|---|---|---|
| 9,379,148 B2 * | 6/2016 | Sung | .................... H01L 27/1288 |
| 9,958,747 B2 | 5/2018 | Bai et al. | |
| 10,007,157 B2 | 6/2018 | Zeng | |
| 2008/0003723 A1 | 1/2008 | Yang et al. | |
| 2014/0076843 A1 * | 3/2014 | Liang | .................. G02F 1/13439 |
| | | | 216/17 |
| 2017/0269445 A1 * | 9/2017 | Bai | ........................ H01L 21/77 |
| 2018/0173067 A1 * | 6/2018 | Huang | .............. G02F 1/133345 |

FOREIGN PATENT DOCUMENTS

| | | |
|---|---|---|
| CN | 105304649 A | 2/2016 |
| CN | 105607365 A | 5/2016 |
| CN | 106206432 A | 12/2016 |
| CN | 106783747 A | 5/2017 |
| JP | H11125831 A | 5/1999 |

OTHER PUBLICATIONS

First Office Action dated Jan. 21, 2019, of corresponding Chinese application CN 201710002000.9 with English translation.

* cited by examiner

METHOD FOR FABRICATING ARRAY SUBSTRATE, ARRAY SUBSTRATE AND DISPLAY DEVICE

This is a National Phase Application filed under 35 U.S.C. 371 as a national stage of PCT/CN2017/096837, filed Aug. 10, 2017, an application claiming the benefit of Chinese Application No. 201710002000.9, filed Jan. 3, 2017, the content of each of which is hereby incorporated by reference in its entirety.

TECHNICAL FIELD

The present disclosure relates to the field of display technology, in particular, to a method for fabricating an array substrate, an array substrate and a display device.

BACKGROUND

As the development of the technology of a thin-film-transistor liquid crystal display panel, the requirement on image quality is becoming higher and higher. Increasing the thickness of the polyimide (PI) film used for preparing an alignment film may improve friction anchoring capacity significantly, and the improved friction capacity may alleviate image sticking caused by the light leakage in a large-sized product. However, an increased thickness of the PI film may cause a problem such as stains in the panel. Since there is a large step at a position of a via-hole, PI is likely to be affected and absorbed into the via-hole during diffusing, which results in conspicuous color mura, and affects the image quality seriously.

SUMMARY

The present disclosure is directed to at least one of problems in the related art, and provides a method for fabricating an array substrate, an array substrate and a display device.

As a first aspect of the present disclosure, provided is a method for fabricating an array substrate, the method including steps of: providing a base substrate which includes a transparent substrate, a data electrode pattern layer formed on the transparent substrate and an insulation layer covering the data electrode pattern layer, the data electrode pattern layer including at least one data electrode; forming a via-hole penetrating through the insulation layer so as to expose at least a part of one of the at least one data electrode; forming a transparent electrode material layer; forming a transparent electrode layer which includes a transparent electrode and a connecting portion connected to the transparent electrode, the connecting portion being located in the via-hole so as to electrically connect the transparent electrode to a corresponding data electrode, and a filling being provided above the connecting portion so as to fill the via-hole covered by the connecting portion.

In some implementations, the step of forming the transparent electrode layer includes: depositing the transparent electrode material layer on the transparent substrate formed with the insulation layer thereon, the insulation layer having the via-hole formed therein; coating a photoresist layer on the transparent electrode material layer.

In some implementations, the photoresist layer is formed by a positive photoresist material, and the step of forming the transparent electrode layer further includes: exposing the photoresist layer by using a half-tone mask, the half-tone mask includes a transparent region, a semitransparent region and a shading region, the shading region corresponds to a region of the transparent electrode material layer for forming the connecting portion, the semitransparent region corresponds to a region of the transparent electrode material layer for forming the transparent electrode, and the transparent region corresponds to a region of the transparent electrode material layer other than the shading region and the semitransparent region; developing the exposed photoresist layer to obtain a protective pattern; etching the transparent electrode material layer provided with the protective pattern thereon to obtain the transparent electrode layer; and ashing the protective pattern to remove a portion of the protective pattern outside a region for forming the filing provided above the connecting portion.

In some implementations, the photoresist layer is formed by a negative photoresist material, and the step of forming the transparent electrode layer includes: exposing the photoresist layer by using a half-tone mask, the half-tone mask includes a transparent region, a semitransparent region and a shading region, the transparent region corresponds to a region of the transparent electrode material layer for forming the connecting portion, the semitransparent region corresponds to a region of the transparent electrode material layer for forming the transparent electrode, and the shading region corresponds to a region of the transparent electrode material layer other than the shading region and the semitransparent region; developing the exposed photoresist layer to obtain a protective pattern; etching the transparent electrode material layer provided with the protective pattern thereon to obtain the transparent electrode layer; and ashing the protective pattern to remove a portion of the protective pattern outside a region for forming the filing provided above the connecting portion.

In some implementations, the step of forming the transparent electrode layer further includes a step of: after the step of ashing the protective pattern, annealing the patterned transparent electrode material layer to obtain the transparent electrode layer.

In some implementations, the data electrode includes a source and a drain, and a part of the drain is exposed in the step of forming the via-hole penetrating through the insulation layer.

In some implementations, the method further includes a step of: after forming the transparent electrode layer, forming an alignment film on the transparent electrode layer.

In some implementations, a material of the alignment film includes polyimide resin.

In some implementations, a material of the transparent electrode material layer includes indium tin oxide.

In some implementations, the step of providing the base substrate includes: forming a gate pattern layer on the transparent substrate, the gate pattern layer including a gate; forming a gate insulation layer to cover the gate pattern layer; and forming an active-layer pattern layer to cover the gate pattern layer, the active-layer pattern layer including an active layer corresponding to the gate, and the active layer being electrically connected to the at least one data electrode.

In some implementations, a material of the active-layer pattern layer includes amorphous silicon.

As a second aspect of the present disclosure, provided is an array substrate fabricated by the method as mentioned above, a filling is provided above the connecting portion of the transparent electrode layer so as to fill the via-hole covered by the connecting portion.

In some implementations, the filling is formed by photoresist.

In some implementations, the array substrate further includes an alignment film formed above the transparent electrode layer.

In some implementations, a material of the alignment film includes polyimide resin.

As a third aspect of the present disclosure, provided is a display device including the array substrate as mentioned above.

In the method for fabricating an array substrate provided by the present disclosure, since a filling is provided above the connecting portion so as to fill the via-hole covered by the connecting portion, the absorption effect on the alignment film at the position of the connecting portion corresponding to the via-hole is alleviated when the alignment film is being coated on the transparent electrode layer. When an array substrate fabricated by the method is applied to a display device, the color mura can be avoided and the quality of the display image is improved.

BRIEF DESCRIPTION OF THE FIGURES

Drawings, which constitute a part of the description, are provided to explain the present disclosure in conjunction with the following specific implementations so as to provide a further understanding, not a limitation, of the present disclosure. In the drawings.

REFERENCE SIGNS 10. transparent substrate; 11. gate; 12. gate insulation layer; 13. active layer 14. data electrode; 15. insulation layer; 16. transparent electrode; 17. connecting portion; 18. filling; 19. photoresist layer; 20. transparent region; 21. semitransparent region; 22. shading region.

DETAILED DESCRIPTION

The specific implementations of the present disclosure will be described in detail below in conjunction with drawings. It should be appreciated that the specific implementations described herein are only for illustration and explanation, not limitation, of the present disclosure.

Figure 1:
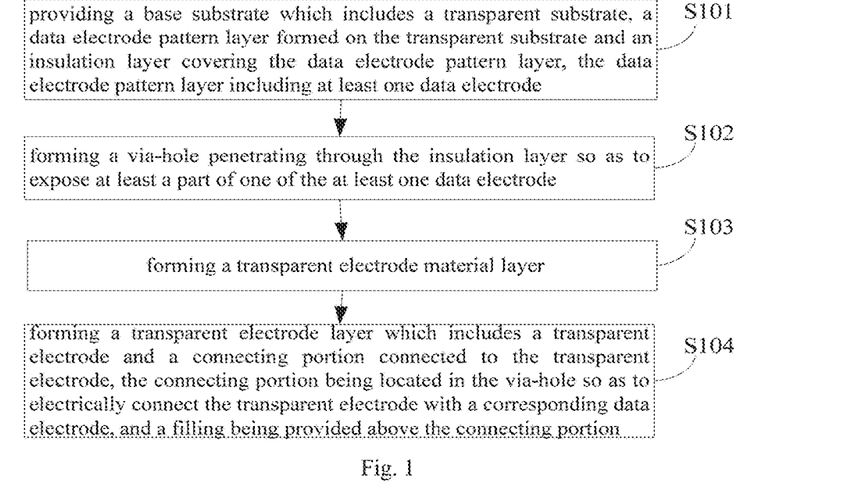
FIG. 1 is a flow chart illustrating a method for fabricating an array substrate according to the present disclosure.

As the first aspect of the present disclosure, provided is a method for fabricating an array substrate. As shown in FIG. 1, the method includes the following steps S101 through S104.

S101. providing a base substrate which includes a transparent substrate, a data electrode pattern layer formed on the transparent substrate and an insulation layer covering the data electrode pattern layer, the data electrode pattern layer including at least one data electrode.

Specifically, the base substrate includes a transparent substrate. A data electrode material layer is deposited on the transparent substrate and is patterned to form the data electrode pattern layer. On the transparent substrate formed with the data electrode pattern layer thereon, the insulation layer is formed to cover the data electrode pattern layer.

It should be noted that the data electrode material layer is generally a metal thin film which is commonly deposited by a magnetron sputtering method; the patterning process generally includes the processes of photoresist coating, exposure, development, etching, photoresist stripping, and so on. That is to say, the photoresist is coated on the deposited metal thin film to cover the metal thin film, then the exposure is performed using a mask to form an exposed region and a non-exposed region, the photoresist in the exposed region is developed and removed (taking a positive photoresist as an example) while the photoresist in the non-exposed region remains; the metal thin film is etched such that a part of the metal thin film in the non-exposed region is not etched due to the protection of the photoresist; finally, the photoresist is stripped so as to obtain the data electrode pattern layer.

It will be appreciated that the base substrate may refer to a base substrate without any film or layer thereon, such as a transparent substrate, or refer to a base substrate having other film(s) or layer(s) or pattern(s) thereon.

S102. forming a via-hole penetrating through the insulation layer so as to expose at least a part of one of the at least one data electrode.

Specifically, on the transparent substrate subjected to Step S101, the via-hole penetrating through the insulation layer is formed by an etching process.

S103. forming a transparent electrode material layer.

Specifically, on the transparent substrate subjected to Step S102, the transparent electrode material layer is formed.

S104. forming a transparent electrode layer which includes a transparent electrode and a connecting portion connected to the transparent electrode, the connecting portion being located in the via-hole so as to electrically connect the transparent electrode to a corresponding data electrode, and a filling being provided above the connecting portion so as to fill the via-hole covered by the connecting portion.

Specifically, on the transparent substrate subjected to Step S103, the transparent electrode layer is formed by a patterning process. The transparent electrode layer includes the transparent electrode and the connecting portion which are connected with each other. From FIGS. 5 to 7 it can be seen that the connecting portion is located in the via-hole formed by Step S102. As described above, the via-hole exposes a part of the data electrode, and the connecting portion connected with the transparent electrode is located in the via-hole to contact with the exposed part of the data electrode, therefore, the via-hole can connect the transparent electrode with the data electrode. From FIGS. 5 to 7 it can also be seen that the upper surface of the connecting portion has the same shape as that of the via-hole, and the filling is provided above the connecting portion. it will be appreciated that the filling may fill at least a part of the region above the connecting portion.

In the method for fabricating an array substrate provided by the present disclosure, the filling is provided above the connecting portion so as to fill the via-hole, that is, the via-hole which is covered by the connecting portion of the transparent electrode is filled. Since the via-hole formed in the insulation layer is filled by the filling, the absorption effect on the alignment film by the connecting portion in the via-hole is alleviated when the alignment film is being coated on the transparent electrode layer. Thus, when an array substrate fabricated by the method is applied to a display device, the color mura can be avoided and the quality of the display image is improved.

It will be appreciated that, when the via-hole covered by the connecting portion is completely filled by the filling, the surface of the transparent electrode layer remains flat. In this case, when the alignment film is coated above the transparent electrode layer, uniform diffusion of the alignment film will not be affected. Thus, the uniformity of the alignment as coated can be ensured, and the problem of stains in the display panel will not occur even when the alignment film is thickened.

As a specific implementation of the data electrode, the data electrode includes a source and a drain. In the step of forming the via-hole penetrating through the insulation layer, a part of the drain is exposed.

Specifically, the data electrode includes the source and the drain, and the via-hole connects the transparent electrode with a part of the drain. In Step S101 as mentioned above, a source-drain metal thin film is deposited by the magnetron sputtering method, and a pattern layer of the source and the drain is formed by a pattern process. The source and the drain may be formed by one or more materials selected from Mo, Al, Al—Nd alloy, Ti and Cu.

Figure 2:
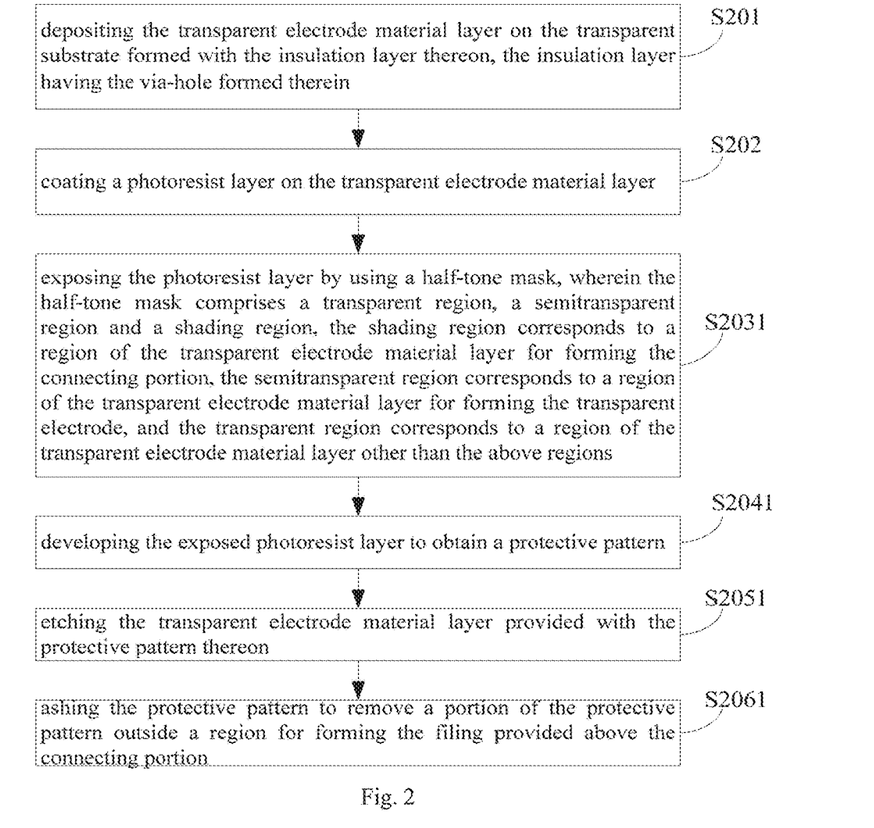
FIG. 2 is a flow chart illustrating an implementation of forming a transparent electrode layer in the method for fabricating an array substrate according to the present disclosure, in which the photoresist layer is made of a positive photoresist material.

For the sake of clearer understanding of the formation of the transparent electrode layer, in a specific implementation, the step of forming the transparent electrode layer in Step S104 may specifically include the steps as shown in FIG. 2.

S201. depositing the transparent electrode material layer on the transparent substrate formed with the insulation layer thereon, the insulation layer having the via-hole formed therein.

Specifically, on the transparent substrate subjected to the above Step S102, the transparent electrode material layer is deposited. In some implementations, the transparent electrode material is indium tin oxide.

S202. coating a photoresist layer on the transparent electrode material layer.

Specifically, the photoresist layer is coated on the transparent substrate subjected to Step S201. The photoresist layer covers the transparent electrode material layer.

In the case that the photoresist layer is formed by a positive photoresist material, the step of forming the transparent electrode layer further includes Steps S2031 through S2061 as shown in FIG. 2.

S2031. exposing the photoresist layer by using a half-tone mask, the half-tone mask includes a transparent region, a semitransparent region and a shading region, the shading region corresponds to a region of the transparent electrode material layer for forming the connecting portion, the semitransparent region corresponds to a region of the transparent electrode material layer for forming the transparent electrode, and the transparent region corresponds to a region of the transparent electrode material layer other than the above regions.

Figure 5:
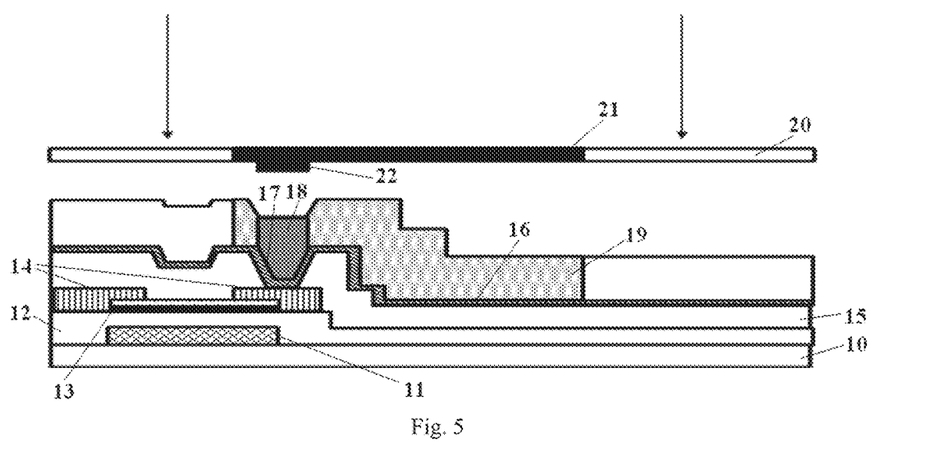
FIG. 5 is a schematic diagram of a structure after the exposure process during the fabrication of the array substrate according to the present disclosure.

Specifically, also referring to FIG. 5, a photoresist layer 19 coated in Step S202 is exposed. In this exposure process, a half-tone mask is used. The half-tone mask as shown in FIG. 5 includes a transparent region 20, a semitransparent region 21 and a shading region 22. Taking the photoresist layer 19 which is formed of the positive photoresist material as an example, it will be appreciated that, in order to form a filling 18 above a connecting portion 17, the shading region 22 of the half-tone mask corresponds to a region of the transparent electrode material layer where the connecting portion 17 corresponding to the via-hole is located (i.e., a position corresponding to the shading region 22 as shown in FIG. 5) when the exposure process is performed.

S2041. developing the exposed photoresist layer to obtain a protective pattern.

Specifically, the photoresist layer exposed by using the half-tone mask in Step S2031 is developed. In this case, the photoresist layer in the transparent region is removed completely after the development, the photoresist layer in the semitransparent region is thinned after the development, and the photoresist layer in the shading region remains entirely. In this way, the protective pattern is obtained finally.

S2051. etching the transparent electrode material layer provided with the protective pattern thereon.

Specifically, the transparent electrode material layer without the photoresist thereon is etched to obtain the transparent electrode layer. It will be appreciated that the photoresist layer in the transparent region is removed completely after the etching process, while the photoresist layer in the shading region is thinned after the etching process but can still fill the region above the connecting portion.

Figure 6:
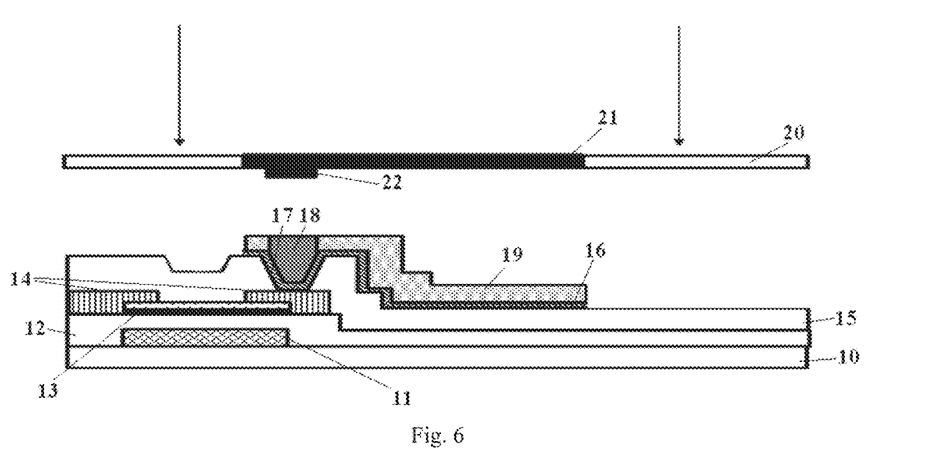
FIG. 6 is a schematic diagram of a structure after the development and the etching processes during the fabrication of the array substrate according to the present disclosure.

FIG. 6 is a schematic diagram of a structure after the development and the etching processes during fabrication of the array substrate. It can be seen from the comparison between FIG. 6 and FIG. 5, after the etching process, the photoresist layer 19 corresponding to the transparent region 20 of the half-tone mask has been removed, the photoresist layer 19 corresponding to the semitransparent region 21 has been thinned, and the photoresist layer 19 corresponding to the shading region 22 has also been thinned. However, it can be seen from FIG. 6 that the thinned photoresist layer 19 corresponding to the shading region 22 can still fill the region positioned above the connecting portion 17.

S2061. ashing the protective pattern to remove a portion of the protective pattern outside a region for forming the connecting portion.

Specifically, the photoresist layer of the protective pattern is ashed so as to obtain the transparent electrode, while the photoresist layer provided on the connecting portion at least partially remains so as to fill up the via-hole covered by the connecting portion. It will be appreciated that the photoresist acts as the filling described previously to fill the region above the connecting portion.

Figure 7:
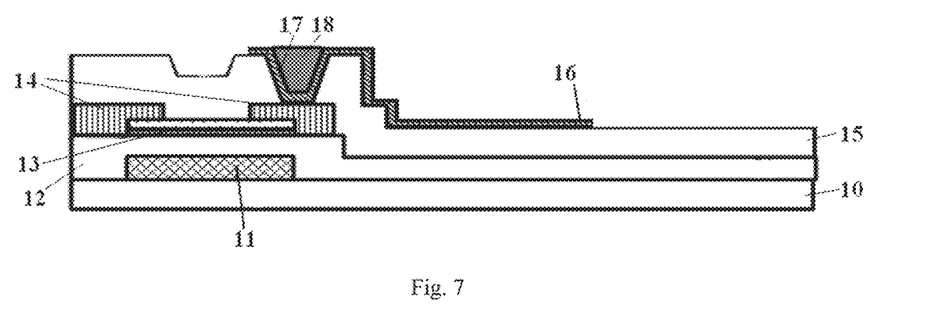
FIG. 7 is a schematic diagram of a structure after the aching process during the fabrication of the array substrate according to the present disclosure.

FIG. 7 is a schematic diagram of a structure obtained after the ashing process during the fabrication of the array substrate. It can be seen from the comparison between FIG. 7 and FIG. 6, after the ashing process, the photoresist layer 19 located on the transparent electrode 16 is removed completely and the transparent electrode 16 is obtained, the photoresist layer 19 above the connecting portion 17 is partially removed, and the remained photoresist fills up the via-hole covered by the connecting portion 17.

Figure 3:
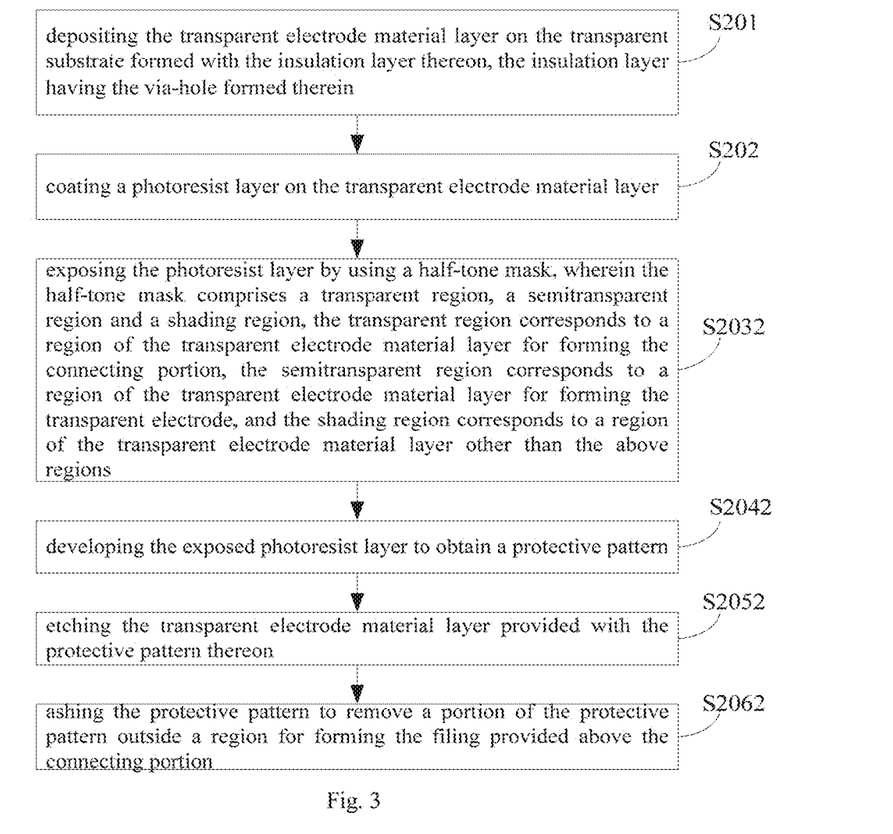
FIG. 3 is a flow chart illustrating another implementation of forming a transparent electrode layer in the method for fabricating an array substrate according to the present disclosure, in which the photoresist layer is made of a negative photoresist material.

In another specific implementation, the step of forming the transparent electrode layer in the above Step S104 may specifically include the steps as shown in FIG. 3.

S201. depositing the transparent electrode material layer on the transparent substrate formed with the insulation layer thereon, the insulation layer having the via-hole formed therein.

S202. coating a photoresist layer on the transparent electrode material layer.

It will be appreciated that Step S201 and Step S202 are the same as those described previously.

In the case where the photoresist layer is formed by a negative photoresist material, the step of forming the transparent electrode layer further includes the steps S2032 through S2062 as shown in FIG. 3.

S2032. exposing the photoresist layer by using a half-tone mask, the half-tone mask includes a transparent region, a semitransparent region and a shading region, the transparent region corresponds to a region of the transparent electrode material layer for forming the connecting portion, the semitransparent region corresponds to a region of the transparent electrode material layer for forming the transparent electrode, and the shading region corresponds to a region of the transparent electrode material layer other than the above regions.

It will be appreciated that, in the case where the photoresist layer 19 is formed by the negative photoresist material, since the negative photoresist material has a property opposite to that of the positive photoresist material, when the photoresist layer 19 is exposed by using the half-tone mask, corresponding relative positions between the transparent electrode material layer and the transparent region 20 and the shading region 22 of the half-tone mask are contrary to those in a case where the photoresist layer 19 is formed by the positive photoresist material. That is to say, in the case where the photoresist layer 19 is formed by the negative photoresist material, the transparent region 20 of the half-tone mask corresponds to the region of the transparent electrode material layer where the connecting portion 17 corresponding to the via-hole is located (not shown in drawings).

S2042. developing the exposed photoresist layer to obtain a protective pattern.

It will be appreciated that, contrary to the case where the photoresist layer 19 is formed of the positive photoresist material, in the case where the photoresist layer 19 is formed of the negative photoresist material, the photoresist layer exposed by using the half-tone mask in Step S2032 is developed, and in this case, the photoresist layer in the shading region is removed completely after the development, the photoresist layer in the semitransparent region is thinned after the development, and the photoresist layer in the transparent region remains entirely. In this way, the protective pattern is obtained finally.

S2052. etching the transparent electrode material layer provided with the protective pattern thereon.

Specifically, the transparent electrode material layer without the photoresist thereon is etched. It will be appreciated that the photoresist layer in the shading region is removed completely after the etching process, while the photoresist layer in the transparent region is thinned after the etching process but can still fill the via-hole covered by the connecting portion.

S2062. ashing the protective pattern to remove a portion of the protective pattern outside a region for forming the filing provided above the connecting portion.

It will be appreciated that Step S2062 is the same as Step S2061.

In the method for fabricating an array substrate provided by the present disclosure, the filling above the connecting portion is formed while forming the transparent electrode layer, no further mask is used, and the complexity of the process is not increased.

In order to obtain the transparent electrode layer, in some implementations, the step of forming the transparent electrode layer further includes a step of: after the step of ashing the protective pattern, annealing the patterned transparent electrode material layer to obtain the transparent electrode layer.

It will be appreciated that the patterned electrode material layer is thermally cured completely after the annealing process and the transparent electrode layer is obtained.

In the case where the array substrate fabricated by the above method is to be applied into a liquid crystal display panel, in order to control a twisted state of the liquid crystal molecules, the method further includes a step of: after the step of forming the transparent electrode layer, forming an alignment on the transparent electrode layer.

As described previously, in the array substrate fabricated by the above method, a filling e.g., the photoresist as described previously) is provided above the connecting portion of the transparent electrode layer corresponding to the via-hole, and thus, the problem that an alignment film is formed non-uniformly on the transparent electrode can be avoided.

In some implementations, the material of the alignment film includes polyimide resin.

In addition, in some implementations, the material of the transparent electrode material layer as described previously includes indium tin oxide.

Figure 4:
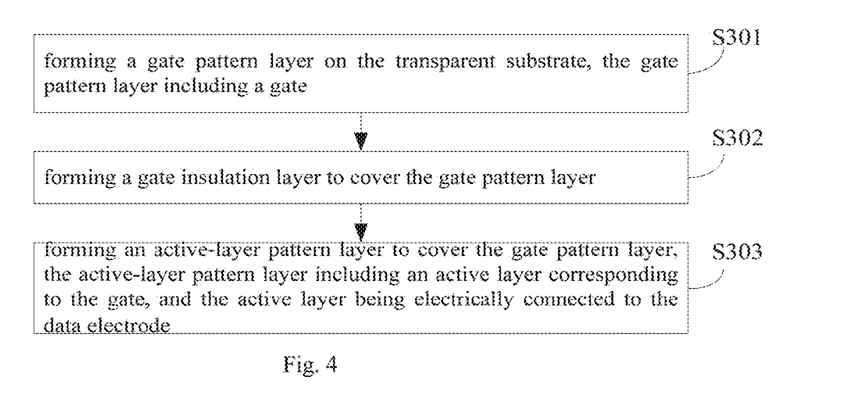
FIG. 4 is a flow chart illustrating a step of providing a base substrate in the method for fabricating an array substrate according to the present disclosure.

In order to improve the method for fabricating an array substrate, as shown in FIG. 4, the step of providing the base substrate includes the following steps S301 to S303.

S301. forming a gate pattern layer on the transparent substrate, the gate pattern layer including a gate.

Specifically, a layer of gate metal thin film is deposited on the transparent substrate as described previously by a magnetron sputtering method, and the gate pattern layer including the gate is formed by a patterning process. The patterning process may specifically include the processes of photoresist coating, exposure, development, etching, photoresist stripping, and so on. That is to say, the photoresist is coated on the deposited gate metal thin film to cover the gate metal thin film; then the exposure is performed using a mask to form an exposed region and a non-exposed region; the photoresist in the exposed region is developed and removed (taking a positive photoresist as an example) while the photoresist in the non-exposed region remains; the gate metal thin film is etched such that a part of the gate metal thin film in the non-exposed region is not etched due to the protection of the photoresist; finally, the photoresist is stripped off to form the gate pattern layer including the gate.

In some implementations, the material of the gate may be formed as a single layer or a laminated layer composed of several layers by using one or more materials selected from Mo, Al, Al—Nd alloy, Ti and Cu.

S302. forming a gate insulation layer to cover the gate pattern layer.

Specifically, on the transparent substrate subjected to Step S301, the gate insulation layer is formed by a preparing method such as thermal growth, atmospheric pressure chemical vapor deposition, low pressure chemical vapor deposition, plasma assisted chemical vapor deposition, sputtering, and the like.

S303. forming an active-layer pattern layer to cover the gate pattern layer, the active-layer pattern layer including an active layer corresponding to the gate, and the active layer being electrically connected to the data electrode.

Specifically, on the transparent substrate subjected to Step S302, an active-layer thin film is deposited and is patterned to form the active-layer pattern layer. The active-layer pattern layer includes the active layer which is electrically connected with the data electrode described previously. In the case where the data electrode includes the source and the drain, the source and the drain are connected with the active layer, respectively.

In some implementations, a material of the active-layer pattern layer includes amorphous silicon.

It will be appreciated that the array substrate is divided into a plurality of pixel units, each of which includes a gate, an active layer, a source and a drain. The structural diagram as shown in any one of FIGS. 5 to 7 only illustrates the structural diagram of one pixel unit, in which a gate 11 is formed above a transparent substrate 10, a gate insulation layer 12 is formed above the gate 11, an active layer 13 is formed above the gate insulation layer 12 and corresponds to the position of the gate 11, data electrodes 14 (specifically, they may be a source and a drain) are located in the layer above the active layer 13 and are respectively connected with the active layer 13, an insulation layer 15 is formed above the data electrodes 14, the via-hole penetrates through the insulation layer 15, the transparent electrode layer is formed above the insulation layer 15, a connecting portion 17 is located in the via-hole, and a transparent electrode 16 is located above the insulation 15 and is connected with the connecting portion 17.

In the method for fabricating an array substrate provided by the present disclosure, by providing a tilling at a region above the connecting portion of the transparent electrode layer corresponding to the position of the via-hole penetrating through the insulation layer, the flatness of the transparent electrode layer is ensured. When an alignment film is coated on the transparent electrode layer, the alignment film can be made to diffuse uniformly over the transparent electrode layer. Thus, the problem in the related art that the alignment film is distributed non-uniformly due to the absorption effect of the via-hole is solved. In addition to solve the above problem, the method does not require more masks, and does not increase the process difficulty.

As the second aspect of the present disclosure, provided is an array substrate which is fabricated by the method as described previously.

Specifically, as shown in FIG. 7, the array substrate includes the transparent substrate 10, the data electrode pattern layer provided on the transparent substrate 10, the insulation layer 15 covering the data electrode pattern layer, the transparent electrode layer located above the insulation layer 15. The transparent electrode layer includes the transparent electrode 16 and the connecting portion 17 connected with the transparent electrode 16. The data electrode layer includes at least one data electrode 14. The via-hole penetrating through the insulation layer 15 is provided in the insulation 15. The via-hole connects the transparent electrode 16 with a part of the data electrode 14. The connecting portion 17 is located in the via-hole. The filling 18 is provided above the connecting portion 17.

In some implementations, the at least one data electrode includes a source and a drain, and the via-hole connects the transparent electrode with a part of the drain.

In some implementations, the filling includes photoresist.

In some implementations, the array substrate further includes an alignment film which is provided above the transparent electrode layer.

In addition, it will be appreciated that, in order to improve the structure of the array substrate, a gate pattern layer located on the transparent substrate, a gate insulation layer above the gate pattern layer, and an active-layer pattern layer located above the gate insulation layer are provided in the base substrate. The gate pattern layer includes a gate, the active-layer pattern layer includes an active layer, the gate is provided so as to correspond to the active layer, and the active layer is connected with the at least one data electrode. In the case where the at least one data electrode includes a source and a drain, the source and the drain are respectively connected with the active layer.

As for descriptions of the materials used in the array substrate, reference may be made to the contents relating to the method for fabricating an array substrate as described previously, and the descriptions will not be repeated here.

The array substrate provided by the present disclosure is fabricated by using the method as described above. In the case where the array substrate is applied into a liquid crystal display panel, a problem of stains in the display panel caused by an increased thickness of the alignment film will not occur. In the case where the liquid crystal display panel having the array substrate is applied into a display device, a problem of color mura will not occur, and the quality of the display image is improved.

As the third aspect of the present disclosure, provided is a display device including the array substrate as described previously.

Specifically, the display device includes a product or a component having the display function, such as a liquid crystal panel, a mobile, a tablet, a display, a laptop, and so on.

Since the display device provided by the present disclosure employs the array substrate as described previously, the quality of the display image is improved.

It will be appreciated that the above implementations are only exemplary implementations for illustrating the principle of the disclosure, and the present disclosure is not limited to them. An ordinary person skilled in the art may make various modifications and improvements without departing from the spirit and essence of the present disclosure. The modifications and the improvements should be considered within the protective scope of the present disclosure.

What is claimed is:

1. A method for fabricating an array substrate, comprising:
    providing a base substrate which comprises a transparent substrate, a data electrode pattern layer formed on the transparent substrate and an insulation layer covering the data electrode pattern layer, the data electrode pattern layer comprising at least one data electrode;
    forming a via-hole penetrating through the insulation layer so as to expose at least a part of one of the at least one data electrode;
    forming a transparent electrode material layer;
    forming a transparent electrode layer which comprises a transparent electrode and a connecting portion connected to the transparent electrode, the connecting portion being located in the via-hole so as to electrically connect the transparent electrode to a corresponding data electrode, and a filling being provided above the connecting portion so as to fill the via-hole covered by the connecting portion;
    depositing the transparent electrode material layer on the transparent substrate formed with the insulation layer thereon, the insulation layer having the via-hole formed therein;
    coating a photoresist layer on the transparent electrode material layer, the photoresist layer is formed by a positive photoresist material;

exposing the photoresist layer by using a half-tone mask, wherein the half-tone mask comprises a transparent region, a semitransparent region and a shading region, the shading region corresponds to a region of the transparent electrode material layer for forming the connecting portion, the semitransparent region corresponds to a region of the transparent electrode material layer for forming the transparent electrode, and the transparent region corresponds to a region of the transparent electrode material layer other than the shading region and the semitransparent region;

developing the exposed photoresist layer to obtain a protective pattern;

etching the transparent electrode material layer provided with the protective pattern thereon to obtain the transparent electrode layer; and ashing the protective pattern to remove a portion of the protective pattern outside a region for forming the filling provided above the connecting portion.

2. The method of claim 1, wherein the photoresist layer is formed by a negative photoresist material, and the step of forming the transparent electrode layer comprises:

exposing the photoresist layer by using a half-tone mask, wherein the half-tone mask comprises a transparent region, a semitransparent region and a shading region, the transparent region corresponds to a region of the transparent electrode material layer for forming the connecting portion, the semitransparent region corresponds to a region of the transparent electrode material layer for forming the transparent electrode, and the shading region corresponds to a region of the transparent electrode material layer other than the shading region and the semitransparent region;

developing the exposed photoresist layer to obtain a protective pattern;

etching the transparent electrode material layer provided with the protective pattern thereon to obtain the transparent electrode layer; and ashing the protective pattern to remove a portion of the protective pattern outside a region for forming the filing provided above the connecting portion.

3. The method of claim 1, wherein the step of forming the transparent electrode layer further comprises a step of:

after the step of ashing the protective pattern, annealing the patterned transparent electrode material layer to obtain the transparent electrode layer.

4. The method of claim 1, wherein the at least one data electrode comprises a source and a drain, and a part of the drain is exposed in the step of forming the via-hole penetrating through the insulation layer.

5. The method of claim 1, further comprising a step of:

after forming the transparent electrode layer, forming an alignment film on the transparent electrode layer.

6. The method of claim 5, wherein a material of the alignment film comprises polyimide resin.

7. The method of claim 1, wherein a material of the transparent electrode material layer comprises indium tin oxide.

8. The method of claim 1, wherein the step of providing the base substrate comprises:

forming a gate pattern layer on the transparent substrate, the gate pattern layer comprising a gate;

forming a gate insulation layer to cover the gate pattern layer; and forming an active-layer pattern layer to cover the gate pattern layer, the active-layer pattern layer comprising an active layer corresponding to the gate, and the active layer being electrically connected to the at least one data electrode.

9. An array substrate fabricated by the method of claim 1, wherein a filling is provided above the connecting portion of the transparent electrode layer so as to fill the via-hole covered by the connecting portion.

10. The method of claim 1, wherein the at least one data electrode comprises a source and a drain, and a part of the drain is exposed in the step of forming the via-hole penetrating through the insulation layer.

11. The method of claim 2, wherein the at least one data electrode comprises a source and a drain, and a part of the drain is exposed in the step of forming the via-hole penetrating through the insulation layer.

12. The method of claim 8, wherein a material of the active-layer pattern layer comprises amorphous silicon.

13. The array substrate of claim 9, wherein the filling is formed by photoresist.

14. The array substrate of claim 9, further comprising an alignment film formed above the transparent electrode layer.

15. A display device, comprising the array substrate of claim 9.

16. The array substrate of claim 14, wherein a material of the alignment film comprises polyimide resin.

* * * * *